United States Patent
Ishikawa

(10) Patent No.: US 9,396,906 B2
(45) Date of Patent: Jul. 19, 2016

(54) TRANSMISSION ELECTRON MICROSCOPE AND METHOD OF DISPLAYING TEM IMAGES

(71) Applicant: JEOL Ltd., Tokyo (JP)

(72) Inventor: Takaki Ishikawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/657,114

(22) Filed: Mar. 13, 2015

(65) Prior Publication Data

US 2015/0262785 A1    Sep. 17, 2015

(30) Foreign Application Priority Data

Mar. 14, 2014 (JP) .................................. 2014-51240

(51) Int. Cl.
*H01J 37/00* (2006.01)
*H01J 37/26* (2006.01)
*H01J 37/21* (2006.01)

(52) U.S. Cl.
CPC ............... *H01J 37/263* (2013.01); *H01J 37/21* (2013.01); *H01J 2237/221* (2013.01)

(58) Field of Classification Search
CPC ....... H01J 37/222; H01J 37/06; H01J 37/263; H01J 37/10; H01J 2237/063; H01J 2237/2802; H01J 2237/221; H01J 2237/2485; H01J 2237/10
USPC .................................. 250/306, 307, 310, 311
See application file for complete search history.

(56) References Cited

FOREIGN PATENT DOCUMENTS

JP          5190131 A         7/1993

*Primary Examiner* — Michael Maskell
(74) *Attorney, Agent, or Firm* — The Webb Law Firm

(57) ABSTRACT

A transmission electron microscope (100) includes an electron beam source (2), an illumination lens system (4), an objective lens (8), a projector lens (12), an imager (14) for capturing the TEM image projected by the projector lens (12), a display controller (22) for causing the TEM image captured by the imager (14) to be displayed at a given size reduction percentage on a display device (20), and a control unit (24) for controlling the objective lens (8). The control unit (24) controls the amount of underfocus of the objective lens (8) on the basis of the size reduction percentage to display an edge enhanced image.

9 Claims, 7 Drawing Sheets

TRANSMISSION ELECTRON MICROSCOPE AND METHOD OF DISPLAYING TEM IMAGES

BACKGROUND OF THE INVENTION

1. Field of the Invention

The present invention relates to a transmission electron microscope (TEM) and method of displaying TEM images.

2. Description of Related Art

When an image is observed on a transmission electron microscope, in order to make a fine observation of a sample to be examined, it is necessary to make sample structures conspicuous. Therefore, when focusing is done, imaging is performed under a slightly underfocused condition rather than under a precisely focused condition.

FIGS. 9-11 are TEM images for illustrating the edge enhancement effects caused by focus variations. FIG. 9 is a TEM image taken under an underfocused condition. FIG. 10 is a TEM image taken under an exactly focused condition. FIG. 11 is a TEM image taken under an overfocused condition. When a membrane hole is observed under an underfocused condition as shown in FIG. 9, variations in phase of electron waves produced at the membrane edge produce a contrasted belt-like region inside the membrane hole. This makes it possible to make sample structures more conspicuous. It is known that the width of the contrasted belt-like region is related to the amount of underfocus. Increases in the width of the contrasted belt-like region are caused by blur produced by an amount of underfocus. The width of the contrasted belt-like region increases in proportion to the amount of defocus.

In the case of a thin-film sample such as a biological tissue section or a macromolecule, an underfocused condition deviating from an exactly focused condition by a certain amount (hereinafter referred to as an optimum amount of underfocus) is referred to an optimally focused condition. This optimum amount of underfocus is determined by matching the width of the contrasted belt-like region on a detector face to the detector resolution. Since the contrasted belt-like region is enlarged or reduced depending on the final magnification, a transmission electron microscope has a different optimum amount of underfocus for a different final magnification. Furthermore, the optimum amount of underfocus varies depending on detector resolution.

Generally, in a transmission electron microscope, exact focus is once achieved by a focusing assisting function, e.g., an image wobbler (see, for example, JP-A-5-190131), and then an optimum amount of underfocus is achieved.

SUMMARY OF THE INVENTION

In recent years, in transmission electron microscopes, digital recorders such as CCD cameras have been used as recording media and recorded images are displayed on LCD monitors.

With the development of electronics, increasing numbers of pixels have become to be recorded by CCD cameras. Not a few CCD cameras have as many as 8 million pixels. On the other hand, with respect to LCD monitors for displaying images, generally used large-screen monitors have only about 2 million pixels (1920☐1080 pixels) which are fewer than the numbers of pixels of images captured by CCD cameras. Therefore, it follows that when an image taken by a transmission electron microscope is fully displayed, the image is minified.

However, when a recorded image is minified and displayed on an LCD monitor, a contrasted belt-like region introduced to make sample structures more conspicuous is also minified. Consequently, the contrasted belt-like region may become lower than the resolution of the LCD monitor, lessening the edge enhancement effects.

The present invention has been made in view of the foregoing problems. One object associated with some aspects of the present invention is to offer a transmission electron microscope capable of displaying an edge enhanced image on a display device. Another object associated with some aspects of the invention is to offer a method capable of displaying an edge enhanced TEM (transmission electron microscope) image on a display device.

(1) A transmission electron microscope associated with the present invention has: an electron beam source producing an electron beam, an illumination lens system for causing the electron beam produced from the electron beam source to impinge on a sample, an objective lens for focusing the electron beam transmitted through the sample to form a focused TEM image, a projector lens for projecting the TEM image focused by the objective lens, an imager for capturing the TEM image projected by the projector lens, a display controller for providing control such that the TEM image captured by the imager is displayed at a given size reduction percentage on a display device, and a control unit for controlling the objective lens. The control unit controls an amount of underfocus of the objective lens on the basis of the size reduction percentage.

In this transmission electron microscope, the width of the contrasted belt-like region of the TEM image captured by the imager can be controlled according to the size reduction percentage. Consequently, if the TEM image is minified and displayed on the display device, the width of the contrasted belt-like region can be optimized. In this transmission electron microscope, therefore, if a TEM image is minified and displayed on the display device, the image can be edge enhanced.

(2) In one feature of this transmission electron microscope, the control unit may control the objective lens such that the amount of underfocus is made to correspond with the size reduction percentage assumed when the TEM image is started to be captured.

In this transmission electron microscope, even when a TEM image is minified and displayed on the display device, the image can be edge enhanced.

(3) In another feature of this transmission electron microscope, the imager may capture the TEM image using an amount of underfocus corresponding with the size reduction percentage assumed when the TEM image is started to be captured. The display controller may minify the TEM image by the size reduction percentage assumed when the TEM image is started to be captured and display the image on the display device.

In this transmission electron microscope, even when a TEM image is minified and displayed on the display device, the image can be edge enhanced. Furthermore, a new TEM image can be displayed at the same size reduction percentage as that of the TEM image displayed when the TEM image is started to be captured.

(4) Another transmission electron microscope associated with the present invention has: an electron beam source producing an electron beam, an illumination lens system for causing the electron beam produced from the electron beam source to impinge on a sample, an objective lens for focusing the electron beam transmitted through the sample to form focused TEM images, a projector lens for projecting the TEM images focused by the objective lens, an imager for capturing the TEM images projected by the projector lens, a display controller for providing control such that the TEM images captured by the imager are displayed at a certain size reduction percentage on a display device, and a control unit for controlling the objective lens. The control unit controls the objective lens to vary an amount of underfocus of the objective lens. The imager captures the TEM images created at different amounts of underfocus of the objective lens. The display controller provides control such that one image is selected from the TEM images captured by the imager on the basis of the size reduction percentage and displayed on the display device.

In this transmission electron microscope, the width of the contrasted belt-like region of TEM images captured by the imager can be controlled according to the size reduction percentage. Therefore, if a TEM image is minified and displayed on the display device, the width of the contrasted belt-like region can be optimized. Consequently, in this transmission electron microscope, when a TEM image is minified and displayed on the display device, the image can be edge enhanced.

In this transmission electron microscope, it is possible to display an edge enhanced TEM image on the display device in a shorter time even if the size reduction percentage is modified, for example, as compared to a case where a TEM image is captured whenever the size reduction percentage is modified.

(5) In a still other feature of this transmission electron microscope, the control unit may control the objective lens such that the amount of underfocus of the objective lens is made to correspond with the size reduction percentage assumed when the TEM images are started to be captured and then to correspond with other size reduction percentage.

In this transmission electron microscope, a TEM image created with an amount of underfocus corresponding to the size reduction percentage assumed when imaging is started to be performed can be first captured. Therefore, a TEM image created with an amount of underfocus corresponding to the size reduction percentage assumed when the capturing is started is not affected by hysteresis produced concomitantly with a modification of the excitation of the objective lens. Consequently, in this transmission electron microscope, the effects of hysteresis on a TEM image created with an amount of underfocus corresponding to the size reduction percentage assumed when the capturing is started can be suppressed.

(6) A method of displaying a TEM image in accordance with the present invention is adapted to display a TEM image at a given size reduction percentage on a display device after the TEM image is captured by an imager. The method starts with controlling an amount of underfocus of an objective lens on the basis of the size reduction percentage and capturing the TEM image. Then, the captured TEM image is minified by the size reduction percentage and displayed on the display device.

In this method of displaying a TEM image, it is possible to control the width of the contrasted belt-like region of the TEM image captured by the imager according to the size reduction percentage. Therefore, if a TEM image is minified and displayed on the display device, the width of the contrasted belt-like region can be optimized. Consequently, in this method of displaying a TEM image, even if a TEM image is minified and displayed on the display device, the image can be edge enhanced.

(7) In one feature of this method of displaying a TEM image, during the step of capturing the TEM image, the objective lens may be controlled such that the amount of underfocus is made to correspond with the size reduction percentage assumed when TEM image is started to be captured.

In this method of displaying a TEM image, if the TEM image is minified and displayed on the display device, the image can be edge enhanced.

(8) Another method of displaying TEM images in accordance with the present invention is adapted to display TEM images at a given size reduction percentage on a display device after the TEM images are captured by an imager. The method starts with capturing the TEM images created with different amounts of underfocus of an objective lens. Then, one image is selected from the TEM images on the basis of the size reduction percentage and displayed on the display device.

In this method of displaying a TEM image, the width of a contrasted belt-like region of each TEM image captured by the imager can be controlled according to the size reduction percentage. Therefore, even if the TEM image is minified and displayed on the display device, the width of the contrasted belt-like region can be optimized. Consequently, in this method of displaying a TEM image, even if a TEM image is minified and displayed on the display device, the image can be edge enhanced.

Furthermore, in this method of displaying a TEM image, if the size reduction percentage is modified, an edge enhanced TEM image can be displayed on the display device in a shorter time than, for example, where a TEM image is captured whenever the size reduction percentage is modified.

(9) In a still other feature of this method of displaying TEM images, during the step of capturing TEM images, the objective lens may be controlled such that the amount of underfocus is made to correspond with the size reduction percentage assumed when the TEM images are started to be captured and then to correspond with other size reduction percentage.

In this method of displaying a TEM image, a TEM image created with an amount of underfocus corresponding with the size reduction percentage assumed when the capturing is started can be first captured. Therefore, the TEM image created with an amount of underfocus corresponding with the size reduction percentage assumed when the capturing is started is not affected by hysteresis produced concomitantly with a modification of the excitation of the objective lens. Consequently, in this method of displaying a TEM image, it is possible to suppress the effects of the hysteresis on the TEM image created with an amount of underfocus corresponding with the size reduction percentage assumed when capturing is started.

BRIEF DESCRIPTION OF THE DRAWING(S)

DESCRIPTION OF THE INVENTION

The preferred embodiments of the present invention are hereinafter described in detail with reference to the drawings. It is to be understood that the embodiments provided below do not unduly restrict the scope of the present invention delineated by the appended claims and that not all the configurations described below are essential constituent components of the invention.

1. First Embodiment

1.1. Transmission Electron Microscope

Figure 1:
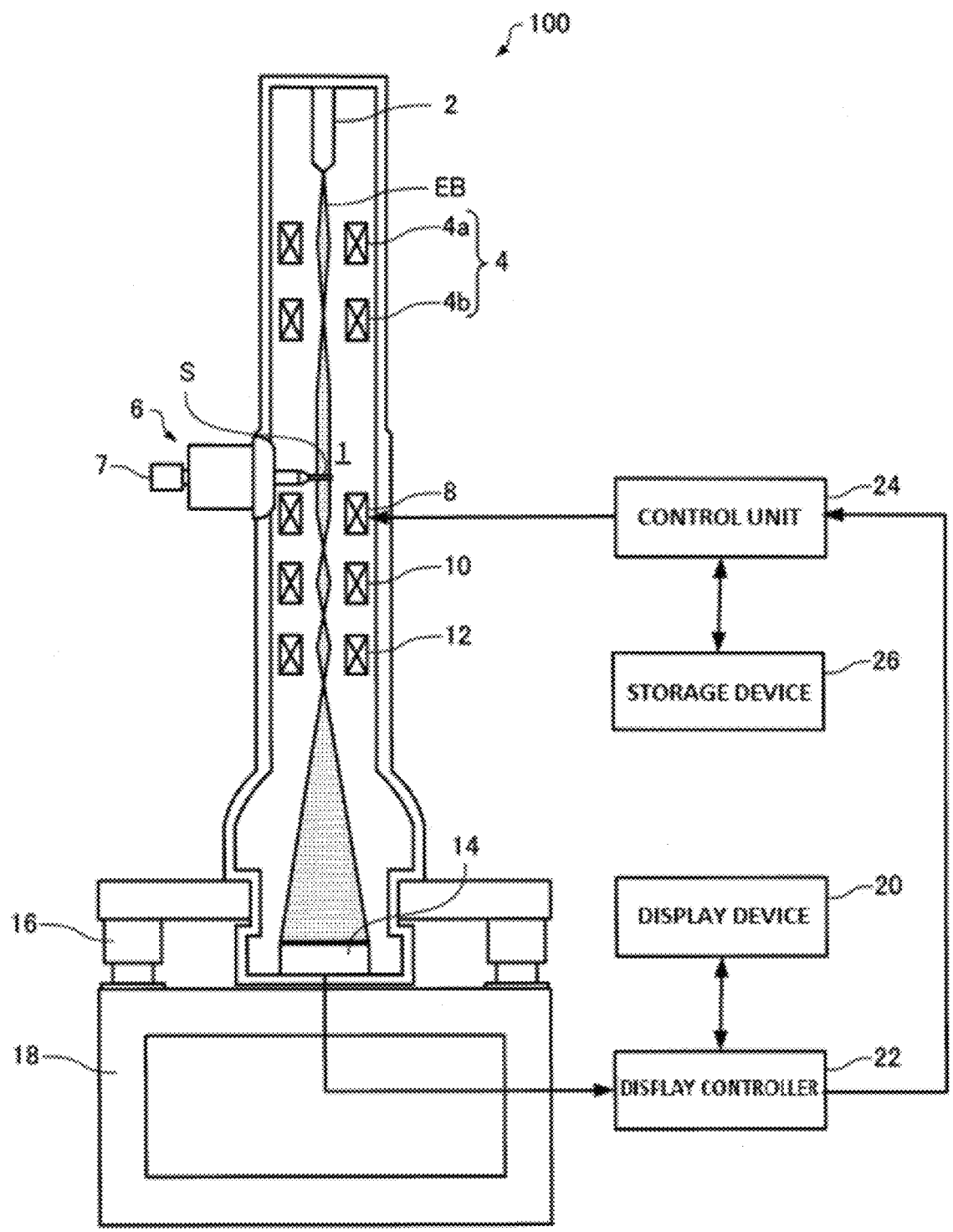
FIG. 1 is a schematic vertical cross section, party in block form, of a transmission electron microscope associated with a first embodiment of the present invention, showing the configuration of the microscope.

A transmission electron microscope associated with a first embodiment of the present invention is first described by referring to FIG. 1, which schematically shows the configuration of the microscope, 100. As shown in FIG. 1, the transmission electron microscope 100 has an electron beam source 2, an illumination lens system 4, a sample stage 6, an objective lens 8, an intermediate lens 10, a projector lens 12, an imager 14, a display device 20, a display controller 22, an optics control unit 24, and a storage device 26.

The transmission electron microscope 100 is an instrument for obtaining transmission electron microscope (TEM) images by transmission electron microscopy. A TEM image is an image obtained by transmission electron microscopy, and is a real space image, for example. Real space images include bright-field images and dark-field images. A bright-field image is produced by causing electrons to pass through a sample S and detecting electrons which have passed through the sample S without being scattered and electrons scattered at small angles. A dark-field image is produced by causing electrons to pass through the sample S and detecting the electrons scattered or diffracted by the sample S.

The electron beam source 2 emits an electron beam EB by accelerating electrons, which are released from a cathode, by means of an anode. An electron gun can be used as the electron beam source 2. No restriction is imposed on the electron gun used as the electron beam source 2. For example, a thermionic electron gun, a thermal field emission electron gun, a cold field emission gun, or other electron gun can be used.

The illumination lens system 4 is disposed behind (on the downstream side relative to the direction of the electron beam EB) the electron beam source 2. The illumination lens system 4 focuses the electron beam EB generated by the electron beam source 2 onto the sample S. The illumination lens system 4 includes a first condenser lens 4a and a second condenser lens 4b, the second lens 4b being a condenser minilens. In the illumination lens system 4, the crossover of the electron beam EB released from the electron beam source 2 is minified by the first condenser lens 4a. The minified beam image is transferred to the object plane of the objective lens 8 by the second condenser lens 4b.

The sample stage 6 holds the sample S thereon. In the illustrated example, the sample stage 6 holds the sample S via a sample holder 7. The sample holder 7, which is held by the sample stage 6, holds the sample S at its front end. The sample stage 6 can place the sample S in position by moving and stopping the sample holder 7. Furthermore, the sample stage 6 can move the sample S in a horizontal direction (perpendicular to the direction of travel of the electron beam EB) and in a vertical direction (along the direction of travel of the electron beam EB). In addition, the sample stage 6 can tilt the sample S.

In the illustrated example, the sample stage 6 is a side-entry stage for inserting the sample S from a side of the polepieces of the objective lens 8. Alternatively, the sample stage 6 may be a top-loading stage (not shown) for inserting the sample S from above the polepieces of the objective lens 8. The objective lens 8 is disposed behind the illumination lens system 4, and is an initial stage of lens for focusing the electron beam EB transmitted through the sample S. The objective lens 8 has an upper polepiece and a lower polepiece (none of which are shown). The objective lens 8 produces a magnetic field between the upper and lower polepieces to focus the electron beam EB. The sample S is placed between the upper and lower polepieces by the sample stage 6 (sample holder 7).

The intermediate lens 10 is disposed behind the objective lens 8. The projector lens 12 is disposed behind the intermediate lens 10. The intermediate lens 10 and the projector lens 12 together operate to further magnify the image focused by the objective lens 8 and to focus the further magnified image onto the imager 14. In a specific example, a TEM image created by the objective lens 8 is focused and magnified by the intermediate lens 10. The intermediate lens 10 then forms a TEM image at the object plane of the projector lens 12. The projector lens 12 further magnifies the TEM image magnified by the intermediate lens 10 and focuses the TEM image onto the imager 14.

The imager 14 captures the TEM image focused by the projector lens 12. For example, the imager 14 is a CCD camera. The imager 14 outputs information about a captured TEM image (hereinafter may be referred to also as the original image). The information about the original image delivered from the imager 14 is processed by the display controller 22 such that a minified TEM image is displayed on the display device 20. The electron microscope 100 has an electron optical column which, in the illustrated example, is mounted on a pedestal 18 via vibration insulators 16.

The display device 20 is used to display the image created by the display controller 22. The function of the display device 20 can be implemented by an LCD, a CRT, or the like. A minified image or a non-minified image generated by the display controller 22 is displayed on the display device 20.

The number of pixels in the imager 14 is greater than the number of pixels in the display device 20. For instance, the number of pixels of the imager 14 is approximately 8 million (3456☐2304) pixels. The number of pixels in the display device 20 is approximately 2 million (1920☐1080) pixels. No restriction is imposed on the number of pixels in the imager 14 or on the number of the pixels in the display device 20 as long as the number of pixels in the imager 14 is greater than the number of pixels in the display device 20.

The display controller 22 provides control such that a TEM image captured by the imager 14 is displayed at a given size reduction percentage on the display device 20. The display controller 22 thins out the pixels of the original image, for example, by a nearest neighbor algorithm or a linear interpolation method, to create a minified image.

A size reduction percentage is represented as the ratio of the length of a minified image to the length of the original image (i.e., the length of a minified image/the length of the original image). Where the size reduction percentage is 50% (½), 4 (2☐2) pixels of the original image corresponds to one pixel in a minified image. Where the size reduction percentage is 25% (¼), 16 (4☐4) pixels of the original image correspond to one pixel in a minified image. Where the size reduction percentage is 100%, one pixel in the original image corresponds to one pixel in a minified image.

The display controller 22 sends information about the size reduction percentage to the optics control unit 24. For example, when a user manipulates a manual control unit (not shown) to enlarge or minify the image displayed on the display device 20, the display controller 22 modifies the size reduction percentage.

The control unit 24 controls the objective lens 8. In particular, the control unit 24 controls the amount of underfocus of the objective lens 8, based on the size reduction percentage. For example, the control unit 24 obtains information about the size reduction percentage from the display controller 22 and controls the objective lens 8 to make the amount of underfocus of the objective lens 8 correspond with the obtained size reduction percentage, i.e., to optimize the amount of underfocus. Consequently, the width of the contrasted belt-like region is optimized (i.e., edge enhanced) in a case where a TEM image is minified by the display controller 22 and displayed on the display device 20. The optimum amount of underfocus depends on the final magnification, the number of pixels in the imager 14, and other factors. In the following description, it is assumed that the final magnification and the number of pixels in the imager 14 are constant.

For example, the optimum value of underfocus assumed when the size reduction percentage is 50% is twice the optimum amount of underfocus assumed when the displayed image is not minified, i.e., the size reduction percentage is 100%. Therefore, the width of the contrasted belt-like region of the TEM image captured by the imager 14 is twice the width of the contrasted belt-like region produced when the displayed image is not minified. Consequently, when the display controller 22 minifies the original image to 50% of the original size and displays the resulting 50% minified image on the display device 20, the width of the contrasted belt-like region on the display device 20 can be made equal to the width of the contrasted belt-like region produced when the displayed image is not minified.

For example, the optimum amount of underfocus assumed when the size reduction percentage is 25% is four times as large as the optimum amount of underfocus assumed when the display image is not minified, i.e., the size reduction percentage is 100%. It follows that the width of the contrasted belt-like region of the TEM image captured by the imager 14 is four times the width of the contrasted belt-like region assumed when the displayed image is not minified. Consequently, when the display controller 22 minifies the original image to one-fourth the original size to form a minified image of 25% size and displays the minified image on the display device 20, the width of the contrasted belt-like region on the display device 20 can be made equal to the width of the contrasted belt-like region occurring when the displayed image is not minified.

The contrasted belt-like region referred to herein is a contrasted belt-like region produced inside edges by variations in electron wave phases when the edges are observed in an underfocused condition. The contrasted belt-like region results in edge enhancement. That is, the structures of the sample S can be made more conspicuous.

Alternatively, the display controller 22 may reduce the image size of a TEM image obtained with an amount of underfocus assumed, for example, when the size reduction percentage is 50% or 25% and store the image in the storage device 26. In this case, the file size can be reduced.

The control unit 24 controls the objective lens 8 to make the amount of underfocus correspond with the size reduction percentage assumed when the imager 14 starts to capture a TEM image, e.g., when the control unit 24 accepts a start signal for starting capturing of a TEM image. The start signal is delivered from the manual control unit to the control unit 24, for example, when the user manipulates the manual control unit (not shown) of the transmission electron microscope 100 to start capturing of a TEM image.

Furthermore, the control unit 24 may operate to control the electron beam source 2, illumination lens system 4, intermediate lens 10, and projector lens 12. Each of the display controller 22 and the control unit 24 may be made of a dedicated circuit and perform the above-described operations and controls. In addition, each of the display controller 22 and the control unit 24 may act as a computer by executing control programs stored in the storage device by means of a CPU (central processing unit) and perform the above-described operations and controls.

The storage device 26 is a working area for the control unit 24. The function of the storage device 26 can be implemented by a RAM or the like. Information about an optimum amount of underfocus achieved when the displayed image is not minified and at each value of the final magnification is stored in the storage device 26. Alternatively, information about optimum amounts of underfocus achieved when the size reduction percentage is 100%, 50%, and 25% and at each value of the final magnification may be stored in the storage device 26.

The transmission electron microscope 100 has the following features. In the microscope 100, the display controller 22 provides control to display a TEM image captured by the imager 14 at a given size reduction percentage on the display device 20. The control unit 24 controls the amount of underfocus of the objective lens 8 according to the size reduction percentage. Therefore, the transmission electron microscope 100 can control the width of the contrasted belt-like region of the TEM image captured by the imager 14 on the basis of the size reduction percentage. Consequently, if a TEM image is minified and displayed on the display device 20, the width of the contracted belt-like region can be optimized. In this case, the image can be edge enhanced.

Figure 2:
FIG. 2 is a TEM image which has been captured with an optimum amount of underfocus used when the size reduction percentage is 100% and which is displayed on a display device at a size reduction percentage of 100%.
Figure 3:
FIG. 3 is a TEM image which has been captured with an optimum amount of underfocus used when the size reduction percentage is 50% and which is displayed on the display device at a size reduction percentage of 100%.

FIG. 2 is a TEM image which has been captured at an optimum amount of underfocus used when the displayed image is not minified, i.e., the size reduction percentage is 100%, and which is displayed on the display device 20 without varying the original size. FIG. 3 is a TEM image which is taken at an optimum amount of underfocus assumed when the size reduction percentage is 50% and which is displayed on the display device 20 without varying the original size. The image shown in FIG. 2 has a contrasted belt-like region whose width is optimal and thus the image is clear. On the other hand, the image shown in FIG. 3 is blurred because the amount of underfocus is excessively large.

Figure 4:
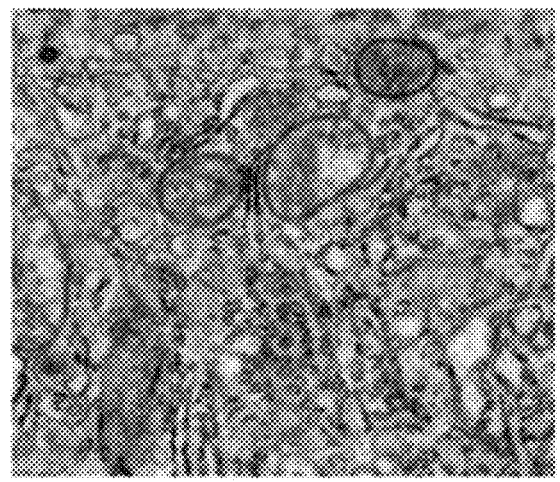
FIG. 4 is a TEM image which has been captured with an optimum amount of underfocus used when the size reduction percentage is 100% and which is displayed on the display device at a size reduction percentage of 50%.
Figure 5:
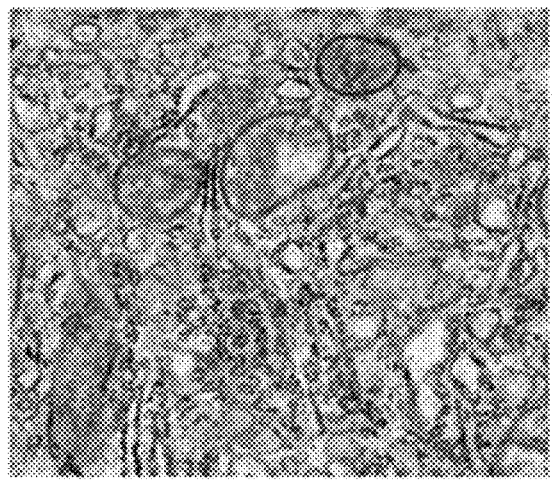
FIG. 5 is a TEM image which has been captured with an optimum amount of underfocus used when the size reduction percentage is 50% and which is displayed on the display device at a size reduction percentage of 50%.

FIG. 4 is a TEM image which has been captured at an optimum amount of underfocus assumed when the size reduction percentage is 100% and which is displayed on the display device 20 at a size reduction percentage of 50%. FIG. 5 is a TEM image which has been captured at an optimum amount of underfocus assumed when the size reduction percentage is 50% and which is displayed on the display device 20 at a size reduction percentage of 50%. Comparison of the images of FIGS. 4 and 5 reveals that the image of FIG. 5 is edge enhanced unlike the image of FIG. 4 because a contrasted belt-like region remains in the image of FIG. 5.

In this way, if a TEM image is minified and displayed on the display device 20, the image can be edge enhanced by controlling the amount of underfocus of the objective lens 8 on the basis of the size reduction percentage.

In the transmission electron microscope 100, the control unit 24 controls the objective lens 8 to make the optimum amount of underfocus correspond with a size reduction percentage assumed when a TEM image is started to be captured. Therefore, in the transmission electron microscope 100, even if a TEM image is minified and displayed on the display device 20, the image can be edge enhanced.

In the transmission electron microscope 100, the imager 14 captures a TEM image at an amount of underfocus corresponding with a size reduction percentage assumed when the capturing of the TEM image is started, and the display controller 22 minifies the TEM image by a size reduction percentage assumed when the TEM image is started to be captured and displays the TEM image on the display device 20. Therefore, in the transmission electron microscope 100, if a TEM image is minified and displayed on the display device 20, the displayed image can be edge enhanced. Furthermore, in the transmission electron microscope 100, a new TEM image can be displayed at the same size reduction percentage as the TEM image currently displayed on the display device 20.

That is, in the transmission electron microscope 100, the currently displayed image can be automatically switched to an image taken at an optimum amount of underfocus corresponding with the size reduction percentage of the image displayed on the display device 20, for example, in response to the size reduction percentage of the image displayed on the display device 20. In consequence, an edge enhanced image can be displayed on the display device 20 at all times.

1.2. Method of Displaying TEM Image

Figure 6:
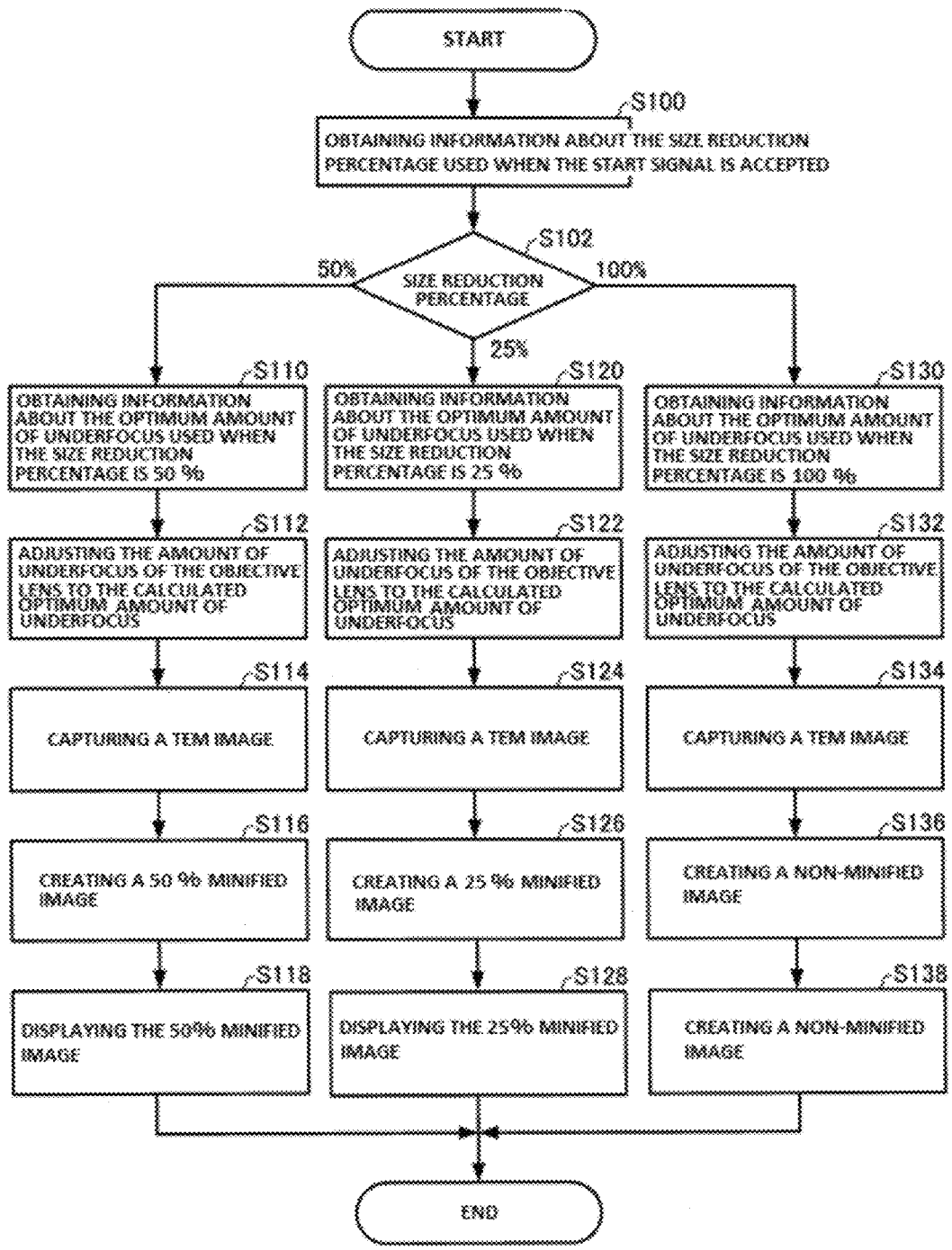
FIG. 6 is a flowchart illustrating one example of method of displaying a TEM image in accordance with the first embodiment of the invention.

A method of displaying a TEM image using the transmission electron microscope 100 in accordance with the first embodiment is next described. FIG. 6 is a flowchart illustrating one example of the method. It is assumed that the final magnification and the number of pixels in the imager 14 are constant.

The method associated with the first embodiment to display a TEM image is used such that a TEM image captured by the imager 14 is displayed on the display device 20 at a given size reduction percentage. This method includes steps S110-S114, steps S120-S124, and steps S130-S134 for controlling the amount of underfocus of the objective lens 8 based on the size reduction percentage and capturing a TEM image and steps S116, S118, S126, S128, S136, and S138 for minifying the captured TEM image and displaying it at the size reduction percentage on the display device 20. This method associated with the first embodiment to display a TEM image is described in detail below by referring to FIGS. 1 and 6.

When the user manipulates the manual control unit (not shown) of the transmission electron microscope 100 to start to capture a TEM image, the manual control unit sends a start signal for starting the capturing to the control unit 24.

In response to the start signal from the manual control unit, the control unit 24 obtains information about a size reduction percentage from the display controller 22, the percentage being used when the start signal is accepted (step S100).

If the decision at step S102 is 50% indicating that the size reduction percentage is 50%, the control unit 24 obtains information about an optimum amount of underfocus used when the size reduction percentage is 50% (step S110). In particular, the control unit 24 first reads information about the optimum amount of underfocus from the storage device 26, the optimum amount being used when the size reduction percentage is 100% and the final magnification is adapted for commencement of capturing of a TEM image. Then, the control unit 24 calculates the optimum amount of underfocus used when the size reduction percentage is 50% by doubling the optimum amount of underfocus used when the displayed image is not minified. As a result, the control unit 24 can derive information about the optimum amount of underfocus used when the size reduction percentage is 50%.

The control unit 24 then controls the objective lens 8 to adjust the optimum amount of underfocus of the objective lens 8 to the calculated optimum amount of underfocus to be assumed when the size reduction percentage is 50% (step S112).

Then, the imager 14 captures a TEM image with the amount of underfocus used when the size reduction percentage is 50% (step S114). The imager 14 sends information about the captured TEM image to the display controller 22.

The display controller 22 reduces the size of the TEM image captured by the imager 14 to 50% of the original size and creates a 50% minified image (step S116).

Then, the display controller 22 displays the created 50% minified image on the display device 20 (step S118). The control unit 24 then ends the present processing subroutine.

If the decision at step S102 is 25% indicating that the size reduction percentage is 25%, the control unit 24 obtains information about the optimum amount of underfocus used when the size reduction percentage is 25% (step S120). In particular, the control unit 24 reads information about the optimum amount of underfocus from the storage device 26, the optimum amount being used when the size reduction percentage is 100% and the final magnification is adapted for commencement of capturing of a TEM image. Then, the control unit 24 computes the optimum amount of underfocus used when the size reduction percentage is 25% by multiplying the optimum amount of underfocus used when the size reduction percentage is 100% by a factor of 4. Consequently, the control unit 24 can obtain information about the optimum amount of underfocus used when the size reduction percentage is 25%.

The control unit 24 then controls the objective lens 8 to adjust the optimum amount of underfocus of the objective lens 8 to the calculated optimum amount of underfocus to be used when the size reduction percentage is 25% (step S122).

The imager 14 captures a TEM image with an optimum amount of underfocus used when the size reduction percentage is 25% (step S124). The imager 14 sends information about the captured TEM image to the display controller 22.

The display controller 22 minifies the TEM image captured by the imager to 14 to 25% of the original size to create a 25% minified image (step S126).

The display controller 22 then displays the created 25% minified image on the display device 20 (step S128). The control unit 24 ends the present processing subroutine.

If the decision at step S102 is 100% indicating that the size reduction percentage is 100%, the control unit 24 obtains information about an optimum amount of underfocus used when the displayed image is not minified, i.e., the size reduction percentage is 100% (step S130). Specifically, the control unit 24 reads information about the optimum amount of underfocus from the storage device 26, the optimum amount being used when the size reduction percentage is 100% and the final magnification is adapted for commencement of a TEM image.

The control unit 24 then controls the objective lens 8 to adjust the amount of underfocus of the objective lens 8 to the optimum amount of underfocus used when the size reduction percentage is 100% (step S132).

The imager 14 then captures a TEM image under the condition where the optimum amount of underfocus is an amount assumed when the displayed image is not minified (step S134). The imager 14 sends information about the captured TEM image to the display controller 22.

The display controller 22 creates a non-minified image from the TEM image captured by the imager 14 (step S136).

The display controller 22 then displays the created non-minified image on the display device 20 (step S138). The display controller 22 ends the present processing subroutine.

The method associated with the first embodiment to display a TEM image has the following features. The method associated with the first embodiment to display a TEM image is used such that a TEM image captured by the imager 14 is displayed on the display device 20 at a given size reduction percentage. This method includes the steps of: controlling the amount of underfocus of the objective lens 8 based on the size reduction percentage and capturing a TEM image; and minifying the captured TEM image by the size reduction percentage and displaying the image on the display device 20. Therefore, the width of a contrasted belt-like region of the TEM image captured by the imager 14 can be controlled according to the size reduction percentage. Consequently, if the TEM image is minified and displayed on the display device 20, the width of the contrasted belt-like region can be optimized. For this reason, in the method associated with the first embodiment to display a TEM image, if a TEM image is minified and displayed on the display device 20, the image can be edge enhanced.

In the method associated with the first embodiment to display a TEM image, during the step of capturing a TEM image, the objective lens 8 is controlled such that the amount of underfocus is made to correspond with a size reduction percentage used when the TEM image is started to be captured. Therefore, in this method, if a TEM image is minified and displayed on the display device 20, the image can be edge enhanced.

2. Second Embodiment

2.1. Transmission Electron Microscope

A transmission electron microscope associated with a second embodiment of the present invention is next described. This microscope is similar in configuration to the transmission electron microscope 100 associated with the first embodiment and already described in connection with FIG. 1. In the following description, only the differences with the microscope 100 associated with the first embodiment are described.

In the transmission electron microscope associated with the first embodiment, the control unit 24 controls the amount of underfocus of the objective lens 8 on the basis of the size reduction percentage. On the other hand, in the transmission electron microscope associated with the second embodiment, the control unit 24 controls the objective lens 8 to vary the amount of underfocus of the objective lens 8. The imager 14 captures plural TEM images created with different amounts of underfocus of the objective lens 8. The display controller 22 provides control such that a TEM image is selected from the captured TEM images on the basis of the size reduction percentage and displayed on the display device 20.

In particular, the control unit 24 adjusts the amount of underfocus of the objective lens 8 to an optimum amount of underfocus used when the size reduction percentage is 100%, to an optimum amount of underfocus used when the size reduction percentage is 50%, and to an optimum amount of underfocus used when the size reduction percentage is 25%. Correspondingly, the imager 14 captures a TEM image at the optimum amount of underfocus used when the size reduction percentage is 100%, a TEM image at the optimum amount of underfocus used when the size reduction percentage is 50%, and a TEM image at the optimum amount of underfocus used when the size reduction percentage is 25%.

Figure 7:
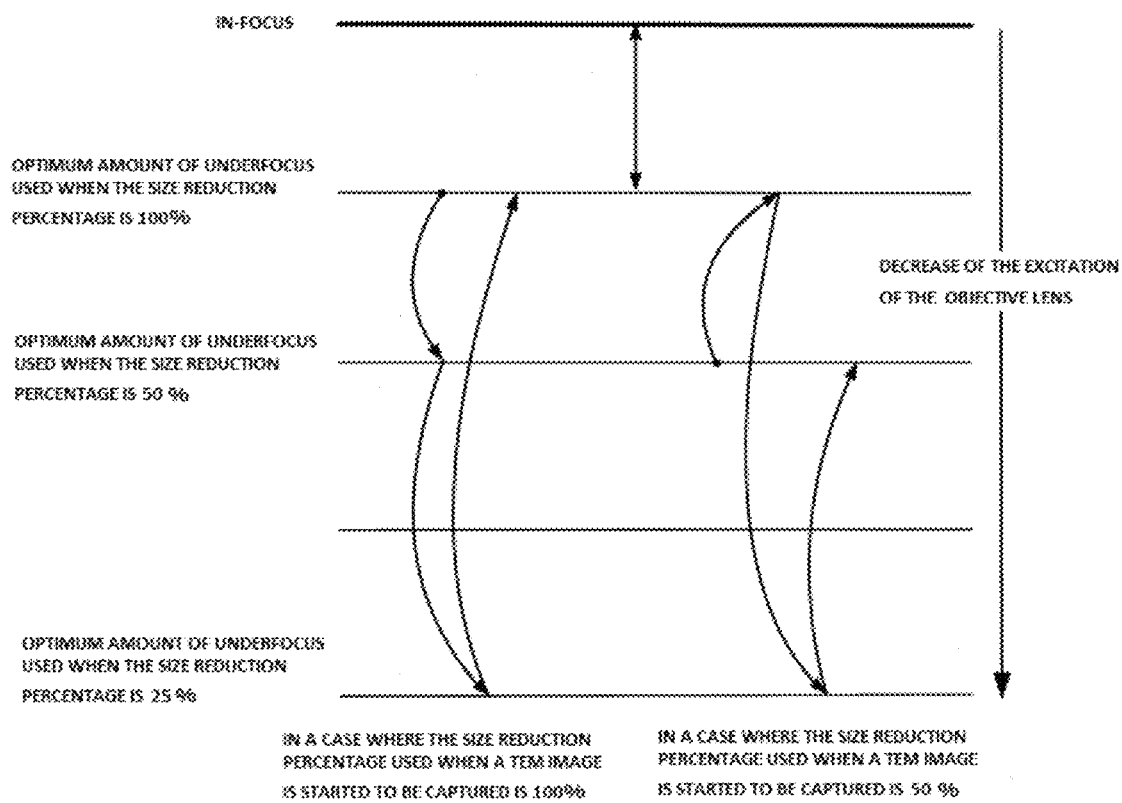
FIG. 7 is a diagram illustrating how the amount of underfocus of the objective lens of the microscope shown in FIG. 1 is varied.

The control unit 24 controls the objective lens 8 such that its amount of underfocus is made to correspond with a size reduction percentage used when a TEM image is started to be captured and then to correspond with other size reduction percentage. FIG. 7 is a diagram illustrating how the amount of underfocus of the objective lens 8 is varied.

As shown in FIG. 7, in a case where the size reduction percentage used when a TEM image is started to be captured is 100% (i.e., the displayed image is not minified), the control unit 24 first adjusts the amount of underfocus of the objective lens 8 to the optimum amount of underfocus used when the size reduction percentage is 100%. Then, the control unit 24 adjusts the amount of underfocus of the objective lens 8 to the optimum amount of underfocus used when the size reduction percentage is 50%. Finally, the control unit 24 adjusts the amount to the optimum amount of underfocus used when the size reduction percentage is 25%. The control unit 24 then adjusts the amount of underfocus back to the optimum amount of underfocus used when the size reduction percentage is 100%.

Where the size reduction percentage used when a TEM image is started to be captured is 50%, the control unit 24 first adjusts the amount of underfocus of the objective lens 8 to the optimum amount of underfocus used when the size reduction percentage is 50%. Then, the control unit 24 adjusts the amount of underfocus of the objective lens 8 to the optimum amount of underfocus used when the size reduction percentage is 100%. Then, the control unit adjusts the amount to the optimum amount of underfocus used when the size reduction percentage is 25%. The control unit 24 adjusts the amount back to the optimum amount of underfocus used when the size reduction percentage is 50%.

The display controller 22 selects a TEM image captured at an optimum amount of underfocus adapted for the size reduction percentage used when a TEM image is started to be captured from a plurality of TEM images captured by the imager 14 on the basis of this size reduction percentage, takes the selected image as an original image, and minifies the original image by the size reduction percentage used when the TEM image is started to be captured, thus creating a minified image.

If the user modifies the displayed magnification of the image displayed on the display device 20, the display controller 22 modifies the size reduction percentage according to the modified magnification of the displayed image. The display controller 22 selects a TEM image taken at an optimum amount of underfocus used at this size reduction percentage, takes the selected image as an original image, and minifies the original image by the modified size reduction percentage, thus creating a minified image.

If the user manipulates the manual control unit to halve the size of the image displayed on the display device 20, the display controller 22 modifies the size reduction percentage from 100% to 50%. The controller 22 selects a TEM image captured at the optimum amount of underfocus used when the size reduction percentage is 50% from a plurality of TEM images captured by the imager 14, takes the selected image as an original image, and minifies the original image to one half of the original size to create a 50% minified image. The display controller 22 displays the 50% minified image on the display device 20.

If the user manipulates the manual control unit to reduce the size of the image displayed on the display device 20 to one quarter of the original size, the display controller 22 modifies the size reduction percentage from 100% to 25%. Then, the controller selects a TEM image captured at the optimum amount of underfocus used when the size reduction percentage is 25% from a plurality of TEM images captured by the imager 14, takes the selected image as an original image, and minifies the original image to 25% of the original size to create a 25% minified image. The display controller 22 displays the 25% minified image on the display device 20.

The transmission electron microscope associated with the second embodiment has the following features. In this transmission electron microscope, the control unit 24 controls the objective lens 8 to vary the amount of underfocus of the objective lens 8. The imager 14 captures a plurality of TEM images created at different amounts of underfocus of the objective lens 8. The display controller 22 provides control such that one image is selected from the TEM images captured by the imager 14 on the basis of the size reduction percentage and displayed on the display device 20. In the transmission electron microscope associated with the second embodiment, plural TEM images created at different amounts of underfocus are previously captured and treated as one set of images. One image can be selected from the set of images according to the size reduction percentage and displayed. Therefore, in the transmission electron microscope associated with the second embodiment, if the size reduction percentage is modified, an edge enhanced image can be displayed on the display device 20 in a shorter time than, for example, where a TEM image is captured whenever the size reduction percentage is modified.

In the transmission electron microscope associated with the second embodiment, the control unit 24 controls the objective lens 8 such that its amount of underfocus is made to correspond with a size reduction percentage used when a TEM image is started to be captured and then to correspond with other size reduction percentage. Therefore, in the transmission electron microscope associated with the second embodiment, a TEM image can be first captured which occurs at an amount of underfocus corresponding to the size reduction percentage used when the capturing is started. Consequently, the TEM image occurring at the amount of underfocus corresponding to the size reduction percentage used when the capturing is started is not affected by hysteresis produced concomitantly with a modification of the excitation of the objective lens 8. Hence, in the transmission electron microscope associated with the second embodiment, it is possible to suppress the effects of the hysteresis on the TEM image occurring at the amount of underfocus corresponding to the size reduction percentage used when the capturing is started.

2.2. Method of Displaying TEM Image

Figure 8:
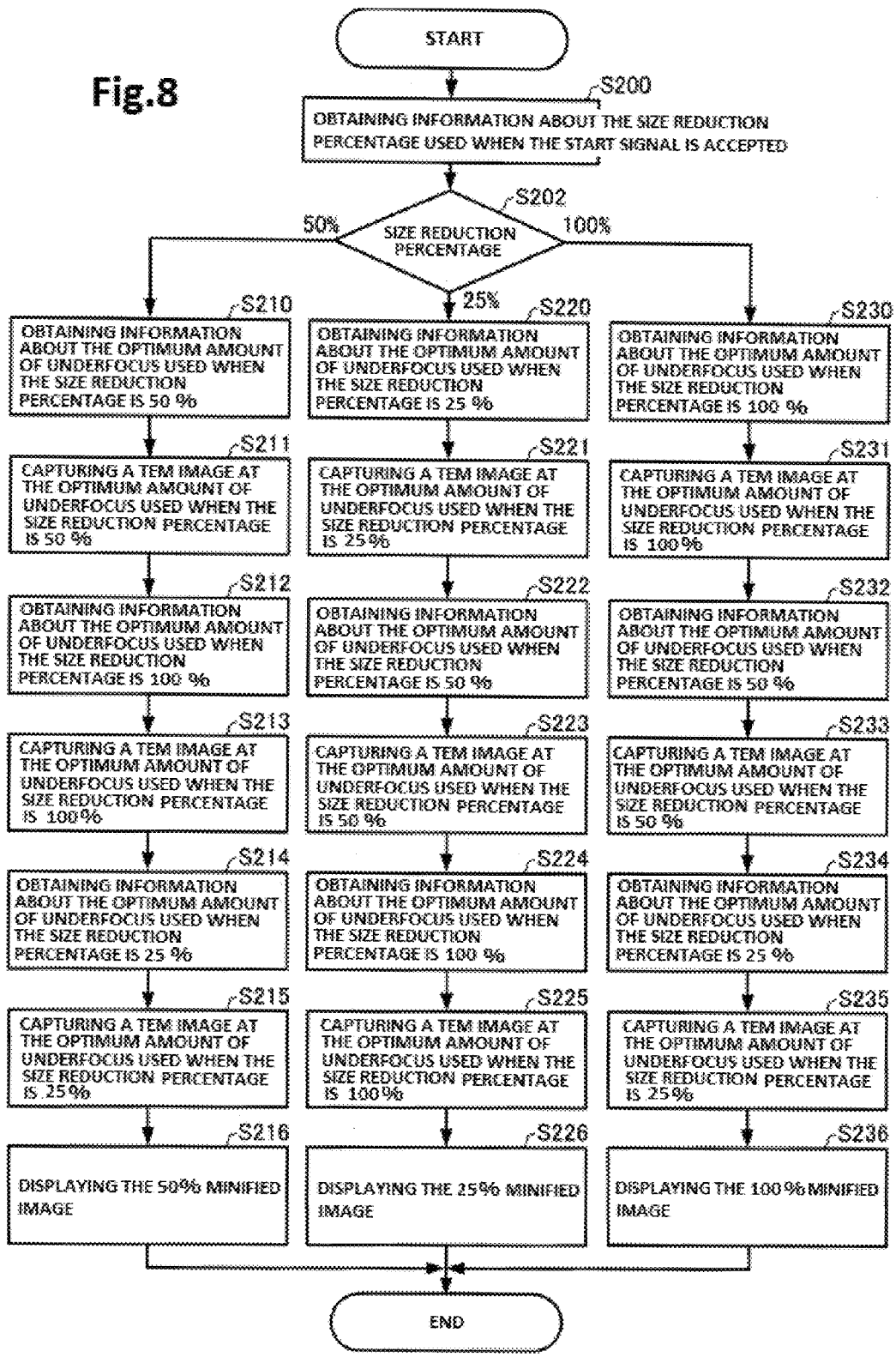
FIG. 8 is a flowchart illustrating one example of method of displaying a TEM image in accordance with a second embodiment of the invention.
Figure 9:
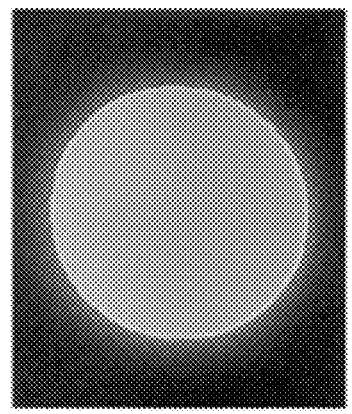
FIGS. 9-11 are TEM images for illustrating the edge enhancement effects caused by focus variations.
Figure 10:
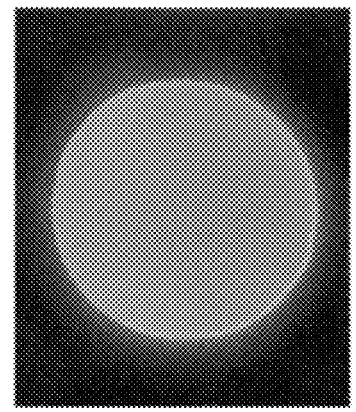
Figure 11:
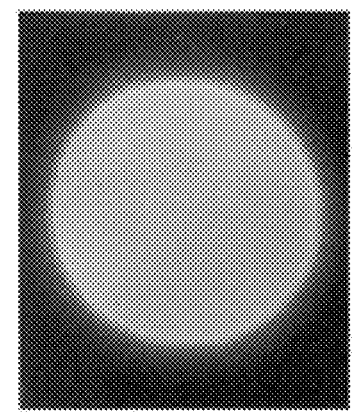

A method associated with the second embodiment to display a TEM image is next described. This method uses the transmission electron microscope associated with the second embodiment. FIG. 8 is a flowchart illustrating one example of the method associated with the second embodiment to display a TEM image. It is assumed that the final magnification and the number of pixels in the imager 14 are constant.

The method associated with the second embodiment to display a TEM image is used to display a TEM image captured by the imager 14 on the display device 20 at a given size reduction percentage. The method includes steps of capturing a plurality of TEM images created at different amounts of underfocus of the objective lens 8 (steps S210-S215, steps S220-S225, steps S230-S235) and steps of selecting one TEM image on the basis of the size reduction percentage and displaying it on the display device 20 (steps S216, S226, S236). The method associated with the second embodiment to display a TEM image is described in further detail below by referring to FIGS. 1 and 8.

If the user manipulates the manual control unit (not shown) to start to capture a TEM image, the manual control unit sends a start signal for starting capturing of a TEM image to the control unit 24.

In response to the start signal from the manual control unit, the control unit 24 obtains information about the size reduction percentage used when the start signal from the display controller 22 was accepted (step S200).

When the decision at step S202 is 50% indicating that the size reduction percentage is 50%, the control unit 24 obtains information about the optimum amount of underfocus used when the size reduction percentage is 50% (step S210). In particular, the control unit 24 computes the optimum amount of underfocus used when the size reduction percentage is 50% by doubling the optimum amount of underfocus used when the size reduction percentage is 100%.

Then, the control unit 24 controls the objective lens 8 and adjusts the amount of underfocus of the objective lens 8 to the computed optimum amount of underfocus used when the size reduction percentage is 50%. The imager 14 captures a TEM image at the optimum amount of underfocus used when the size reduction percentage is 50% (step S211). The imager 14 sends information about the captured TEM image to the storage device 26.

The control unit 24 then obtains information about the optimum amount of underfocus used when the size reduction percentage is 100% (step S212).

The control unit 24 then controls the objective lens 8 to adjust the amount of underfocus of the objective lens 8 to the optimum amount of underfocus used when the size reduction percentage is 100%. The imager 14 captures a TEM image at the optimum amount of underfocus used when the size reduction percentage is 100% (step S213). The imager 14 sends information about the captured TEM image to the storage device 26.

The control unit 24 then obtains information about the optimum amount of underfocus used when the size reduction percentage is 25% (step S214). In particular, the control unit 24 calculates the optimum amount of underfocus used when the size reduction percentage is 25% by multiplying the optimum amount of underfocus used when the size reduction percentage is 100% by a factor of 4.

The control unit 24 then controls the objective lens 8 to adjust the amount of underfocus of the objective lens 8 to the calculated optimum amount of underfocus used when the size reduction percentage is 25%. The imager 14 captures a TEM image using the optimum amount of underfocus used when the size reduction percentage is 25% (step S215). The imager 14 then sends information about the captured TEM image to the storage device 26.

The display controller 22 then reduces the size of the TEM image stored in the storage device 26 to 50% of the original size to form a 50% minified image and displays it on the display device 20 (step S216). The control unit 24 adjusts the amount of underfocus of the objective lens 8, for example, back to the optimum amount of underfocus used when the size reduction percentage is 50%, and ends the present processing subroutine.

If the decision at step S202 is 25% indicating that the size reduction percentage is 25%, the control unit 24 obtains information about the optimum amount of underfocus used when the size reduction percentage is 25% (step S220). The control unit 24 calculates an optimum amount of underfocus to be assumed when the size reduction percentage is 25% by multiplying the optimum amount of underfocus used when the size reduction percentage is 100% by a factor of 4.

The control unit 24 then controls the objective lens 8 to adjust the amount of underfocus of the objective lens 8 to the calculated optimum amount of underfocus used when the size reduction percentage is 25%. The imager 14 captures a TEM image using the optimum amount of underfocus used when the size reduction percentage is 25% (step S221). The imager 14 sends information about the captured TEM image to the storage device 26.

The control unit 24 then obtains information about the optimum amount of underfocus used when the size reduction percentage is 50% (step S222).

The control unit 24 then controls the objective lens 8 to adjust the amount of underfocus of the objective lens 8 to the optimum amount of underfocus used when the size reduction percentage is 50%. The imager 14 captures a TEM image using the optimum amount of underfocus used when the size reduction percentage is 50% (step S223). The imager 14 sends information about the captured TEM image to the storage device 26.

The control unit 24 then obtains information about the optimum amount of underfocus used when the size reduction percentage is 100% (step S224).

The control unit 24 then controls the objective lens 8 to adjust the amount of underfocus of the lens 8 to the optimum amount of underfocus used when the size reduction percentage is 100%. The imager 14 captures a TEM image using the optimum amount of underfocus used when the size reduction percentage is 100% (step S225). The imager 14 sends information about the captured TEM image to the storage device 26.

The display controller 22 then minifies the TEM image stored in the storage device 26 to 25% of the original size to create a 25% minified image and displays it on the display device 20 (step S226). The control unit 24 adjusts the amount of underfocus of the objective lens 8, for example, back to the optimum amount of underfocus used when the size reduction percentage is 25%, and ends the present processing subroutine.

If the decision at step S202 is 100% indicating that the size reduction percentage is 100%, the control unit 24 obtains information about the optimum amount of underfocus used when the size reduction percentage is 100% (step S230).

The control unit 24 controls the objective lens 8 to adjust the amount of underfocus of the objective lens 8 to the optimum amount of underfocus used when the size reduction percentage is 100%. The imager 14 captures a TEM image at the optimum amount of underfocus used when the size reduction percentage is 100% (step S231). The imager 14 then sends information about the captured TEM image to the storage device 26. The control unit 24 then obtains information about the optimum amount of underfocus used when the size reduction percentage is 50% (step S232).

The control unit 24 then controls the objective lens 8 to adjust the amount of underfocus of the lens 8 to the optimum amount of underfocus used when the size reduction percentage is 50%. The imager 14 captures a TEM image at the optimum amount of underfocus used when the size reduction percentage is 50% (step S233). The imager 14 sends information about the captured TEM image to the storage device 26.

The control unit 24 then obtains information about the optimum amount of underfocus used when the size reduction percentage is 25% (step S234). The control unit 24 then controls the objective lens 8 to adjust the amount of underfocus of the lens 8 to the optimum amount of underfocus used when the size reduction percentage is 25%. The imager 14 captures a TEM image at the optimum amount of underfocus used when the size reduction percentage is 25% (step S235). The imager 14 sends information about the captured TEM image to the storage device 26.

The display controller 22 minifies the TEM image stored in the storage device 26 to 100% of the original size, i.e., does not minify the TEM image, to create a 100% minified image and displays this non-minified image on the display device 20 (step S236). The control unit 24 adjusts the amount of underfocus of the objective lens 8, for example, back to the optimum amount of underfocus used when the size reduction percentage is 100%, and ends the present processing subroutine.

The method associated with the second embodiment to display a TEM image has the following features. This method is used to display a TEM image captured by the imager 14 on the display device 20 at a given size reduction percentage. This method includes the steps of: capturing a plurality of TEM images created at different amounts of underfocus of the objective lens 8; and selecting one TEM image from the plurality of TEM images on the basis of the size reduction percentage and displaying the selected image on the display device 20. Therefore, the width of the contrasted belt-like region of each TEM image captured by the imager 14 can be controlled according to the size reduction percentage. Consequently, if a TEM image is minified and displayed on the display device 20, the width of the contrasted belt-like region can be optimized. Therefore, in the method associated with the second embodiment to display a TEM image, if the TEM image is minified and displayed on the display device 20, the image can be edge enhanced.

Furthermore, in the method associated with the second embodiment to display a TEM image, if the display magnification of the image displayed on the display device 20 is modified, the display controller 22 modifies the size reduction percentage according to the modified display magnification of the image. The display controller 22 selects a TEM image captured at an optimum amount of underfocus used when this size reduction percentage is employed, takes this selected image as an original image, and minifies it by the modified size reduction percentage to form a minified image. Consequently, if the size reduction percentage is modified, an edge enhanced TEM image can be displayed on the display device 20 in a shorter time than, for example, where a TEM image is captured whenever the size reduction percentage is modified.

In the method associated with the second embodiment to display a TEM image, during the step of capturing a TEM image, the objective lens 8 is controlled such that its amount of underfocus is made to correspond with a size reduction percentage assumed when the TEM image is started to be captured and then to correspond with other size reduction percentage. Consequently, in the method associated with the second embodiment to display a TEM image, it is possible to suppress the effects of hysteresis on a TEM image created at an amount of underfocus corresponding with the size reduction percentage assumed when the capturing is started.

The present invention embraces configurations (e.g., configurations identical in function, method, and results or identical in purpose and advantageous effects) which are substantially identical to the configurations described in connection with the above embodiments. Furthermore, the invention embraces configurations which are similar to the configurations described in connection with the above embodiments except that their nonessential portions have been replaced. Additionally, the invention embraces configurations which are identical in advantageous effects to, or which can achieve the same object as, the configurations described in connection with the above embodiments. Further, the invention embraces configurations which are similar to the configurations described in connection with the above embodiments except that a well-known technique is added.

The invention claimed is:

1. A transmission electron microscope comprising:
an electron beam source producing an electron beam;
an illumination lens system for causing the electron beam produced from the electron beam source to impinge on a sample;
an objective lens for focusing the electron beam transmitted through the sample to form a focused TEM image;
a projector lens for projecting the TEM image focused by the objective lens;
an imager for capturing the TEM image projected by the projector lens;
a display controller for providing control such that the TEM image captured by the imager is displayed at a given size reduction percentage on a display device; and
a control unit for controlling the objective lens;
wherein the control unit controls an amount of underfocus of the objective lens on the basis of the size reduction percentage.

2. A transmission electron microscope as set forth in claim 1, wherein said control unit controls said objective lens such that the amount of underfocus is made to correspond with the size reduction percentage used when said TEM image is started to be captured.

3. A transmission electron microscope as set forth in claim 2, wherein said imager captures said TEM image using an amount of underfocus corresponding with the size reduction percentage used when the TEM image is started to be captured, and wherein said display controller minifies the TEM image by the size reduction percentage used when the TEM is started to be captured and displays the minified image on said display device.

4. A transmission electron microscope according to claim 1
wherein the control unit controls the objective lens to vary an amount of underfocus of the objective lens on the basis of the size reduction percentage;
wherein the imager captures said TEM images created at different amounts of underfocus of the objective lens; and
wherein the display controller provides control such that one image is selected from the TEM images captured by the imager on the basis of the size reduction percentage and displayed on the display device.

5. A transmission electron microscope as set forth in claim 4, wherein said control unit controls said objective lens such that the amount of underfocus of the objective lens is made to correspond with said size reduction percentage used when the TEM images are started to be captured and then to correspond with other size reduction percentage.

6. A method of displaying a TEM image at a given size reduction percentage on a display device after the TEM image is captured by an imager with a transmission electron microscope comprising:
an electron beam source producing an electron beam;
an illumination lens system for causing the electron beam produced from the electron beam source to impinge on a sample;
an objective lens for focusing the electron beam transmitted through the sample to form a focused TEM image;
a projector lens for projecting the TEM image focused by the objective lens;
the imager for capturing the TEM image projected by the projector lens;
a display controller for providing control such that the TEM image captured by the imager is displayed at a given size reduction percentage on a display device; and
a control unit for controlling the objective lens,
said method comprising the steps of:
controlling an amount of underfocus of an objective lens on the basis of the size reduction percentage and capturing the TEM image; and
minifying the captured TEM image by the size reduction percentage and displaying the minified image on the display device.

7. A method of displaying a TEM image as set forth in claim 6, wherein during the step of capturing the TEM image, said objective lens is controlled such that the amount of underfocus is made to correspond with said size reduction percentage used when the TEM image is started to be captured.

8. A method of displaying TEM images as set forth in claim 6, wherein at a given size reduction percentage on a display device after the TEM images are captured by an imager, said method comprising the further steps of:
capturing said TEM images created at different amounts of underfocus of an objective lens; and
selecting one image from the TEM images on the basis of the size reduction percentage and displaying the selected image on the display device.

9. A method of displaying TEM images as set forth in claim 8, wherein during the step of capturing the TEM images, said objective lens is controlled such that the amount of underfocus is made to correspond with said size reduction percentage used when the TEM images are started to be captured and then to correspond with other size reduction percentage.

* * * * *